United States Patent
Hsu et al.

(10) Patent No.: US 6,952,369 B2
(45) Date of Patent: Oct. 4, 2005

(54) METHOD FOR OPERATING A NAND-ARRAY MEMORY MODULE COMPOSED OF P-TYPE MEMORY CELLS

(75) Inventors: Ching-Hsiang Hsu, Hsin-Chu (TW); Ching-Sung Yang, Hsin-Chu (TW); Jih-Wen Chou, Hsin-Chu (TW); Cheng-Tung Huang, Kao-Hsiung (TW); Chih-Hsun Chu, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 57 days.

(21) Appl. No.: 10/707,562

(22) Filed: Dec. 22, 2003

(65) Prior Publication Data

US 2005/0030789 A1 Feb. 10, 2005

Related U.S. Application Data

(60) Provisional application No. 60/491,964, filed on Aug. 4, 2003.

(51) Int. Cl.$^7$ .............................................. G11C 16/04
(52) U.S. Cl. ............................ 365/185.18; 365/185.03; 365/185.29
(58) Field of Search ....................... 365/185.18, 185.03, 365/185.29, 185.28, 185.17

(56) References Cited

U.S. PATENT DOCUMENTS 6,735,125 B2 * 5/2004 Hirano .................. 365/185.29

* cited by examiner

Primary Examiner—David Lam
(74) Attorney, Agent, or Firm—Winston Hsu

(57) ABSTRACT

A method for writing a memory module includes providing a plurality of memory cells, applying a first transmission line voltage to the first transmission line of the column of a memory cell, turning on a P-type channel of a memory cell between the memory cell to be written and the first transmission line of the column of the memory cell, turning off the P-type channel of at least one memory cell between the memory cell and the second transmission line of the column of the memory cell, applying a word line voltage to a word line connected to the memory cell, in order to inject hot electrons on a junction between the substrate and the first P-type doped region of the memory cell into a silicon nitride layer of the memory cell using band-to-band tunneling injection, and applying a substrate voltage to the substrates of the plurality of memory cells.

16 Claims, 10 Drawing Sheets

| Voltage | Write | Read | Erase |
| --- | --- | --- | --- |
| $V_G$ | 6 | 0 | -6 |
| $V_1$ | -4 | 0 | FL |
| $V_2$ | FL | -1.5 | 6 |
| $V_{NW}$ | 2 | 0 | 6 |
| WL1 | -6 | -3.3 | -6 |
| WL2 | 6 | 0 | -6 |
| WL3 | FL | -3.3 | -6 |
| WL4 | FL | -3.3 | -6 |
| BL1 | FL | FL | FL |
| BL2 | -4 | 0 | FL |
| BL3 | FL | FL | FL |
| SL1 | FL | FL | 6 |
| SL2 | FL | -1.5 | 6 |
| SL3 | FL | FL | 6 |

Fig. 10

METHOD FOR OPERATING A NAND-ARRAY MEMORY MODULE COMPOSED OF P-TYPE MEMORY CELLS

This application claims the benefit of Provisional Application No. 60/491,964, filed Aug. 4, 2003.

BACKGROUND OF INVENTION

1. Field of the Invention

The present invention relates to a method for operating a memory module, and more specifically, to a method for operating a NAND-array memory module composed of P-type memory cells.

2. Description of the Prior Art

Flash memory can be divided into P-channel flash memory and N-channel flash memory according to the type of its composing memory cells. Memory cells of an N-channel flash memory are formed on a P-type substrate, with two N-type doped regions respectively used as a source and a drain of each memory cell. Memory cells of a P-channel flash memory are formed on an N-type well, with two P-type doped regions respectively used as a source and a drain of each memory cell. Generally speaking, memory cells of an N-channel flash memory have a faster operational speed than memory cells of a P-channel flash memory. However, memory cells of an N-channel flash memory require higher voltage and power, while memory cells of a P-channel flash memory operated with lower voltage and power.

According to the structure, flash memory can be divided into NOR flash memory and NAND flash memory. The drains of memory cells of a NOR flash memory are connected in parallel for a faster reading speed, which is suitable for a code flash memory mainly used for executing program code. The drains and sources of two neighboring memory cells of a NAND flash memory are serially connected for integrating more memory cells per unit area, which is suitable for a data flash memory mainly used for data storage. NAND flash memory and NOR flash memory have different operating methods. Typcially, a NAND flash memory composed of N-channel memory cells utilizes Fowler-Nordheim (FN) tunneling during writing operations, while a NOR flash memory composed of N-channel memory cells utilizes channel hot electron injection during writing operations.

In 1992, in their paper "A High Speed, Low Power P-Channel Flash EEPROM Using Silicon Rich Oxide as Tunneling Dielectric" in International Conference on Solid State Devices and Materials (SSDM), p. 140–p. 142, Hsu et al. disclosed that the hot electron injection current in a P-channel memory can be larger by two orders of magnitude than that in an N-channel memory, and the channel current in a P-channel memory can be less by two orders of magnitude than that in an N-channel memory.

In 1995, T. Ohnakado et al. of Mitsubushi Co. disclosed a technology using a gate induced drain leakage (GIDL) current accelerated by a lateral electric field to generate a hot electron, which has been applied in the writing operation of a P-channel flash memory, in their paper "Novel Electron Injection Method Using Band-to-Band Tunneling Induced Hot Electron (BBHE) for Flash Memory with a P-Channel Cell".

As mentioned above, although N-channel flash memory has a faster operating speed than P-channel flash memory, P-channel flash memory can operate under lower voltage and power, which is more suitable for portable electronic products requiring lower power consumption rather than N-channel flash memory. As technology progresses, the operational methods of P-channel flash memory are continuously being renewed. However in practical applications, both NAND flash memory composed of P-channel memory cells and NOR flash memory composed of P-channel memory cells require better operating methods for better performance.

SUMMARY OF INVENTION

It is therefore a primary objective of the present invention to provide a method for operating a NAND-array memory module composed of P-type memory cells.

Briefly summarized, the present invention provides a method for writing a memory module including providing a plurality of memory cells, wherein each memory cell stores 2-bit data and comprises a substrate, a first P-type doped region, a second P-type doped region, an oxide-nitride-oxide (ONO) layer, and a gate. The plurality of memory cells are arranged in matrix with the gates of the memory cells on the same row and connected to the same word line. The neighboring memory cells are in the same column sharing the same P-type doped region, the first P-type doped region of the first memory cell in each column is connected to a first transmission line in the same column, and the second P-type doped region of the last memory cell in each column is connected to a second transmission line in the same column.

The method for writing a memory module further includes applying a first transmission line voltage to the first transmission line of the column to which a memory cell to be written belongs to, and turning on a P-type channel of the memory cell between the memory cell to be written and the first transmission line of the column which the memory cell to be written belongs to. In order to transmit the first transmission line voltage to the first P-type doped region of the memory cell to be written, the P-type channel of at least one memory cell between the memory cell to be written and the second transmission line of the column which the memory cell to be written belongs to is turned off. A substrate voltage is applied to the substrates of the plurality of memory cells. A word line voltage is applied to a word line connected to the memory cell to be written, in order to inject hot electrons on a junction between the substrate and the first P-type doped region of the memory cell to be written into a silicon nitride layer of the memory cell to be written by band-to-band tunneling (BTBT) injection.

The present invention further provides a method for reading a memory module. The method includes providing a plurality of memory cells, applying a first transmission line voltage to the first transmission line of the column which a memory cell to be read belongs to, applying a second transmission line voltage lower than the first transmission line voltage to the second transmission line of the column which the memory cell to be read belongs to, applying a voltage equal to the first transmission line voltage to a word line connected to the memory cell to be read, applying a voltage equal to the first transmission line voltage to the substrates of the plurality of memory cells, and applying a word line voltage to the remaining word lines not connected to the memory cell to be read in order to turn on a P-type channel of the memory cell, transmit the second transmission line voltage to the second P-type doped region of the memory cell to be read, and enlarge a depletion region between the second P-type doped region and the substrate of the memory cell to be read.

The present invention further provides a method for erasing a memory module including providing a plurality of memory cells, applying a word line voltage to word lines of the plurality of memory cells, applying a first transmission line voltage larger than the word line voltage to the first transmission line of the plurality of memory cells, and applying a voltage equal to the first transmission line voltage to the substrates of the plurality of memory cells.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

FIG. 10 is a voltage contrast list according to the preferred embodiment of the present invention.

DETAILED DESCRIPTION

Figure 1:
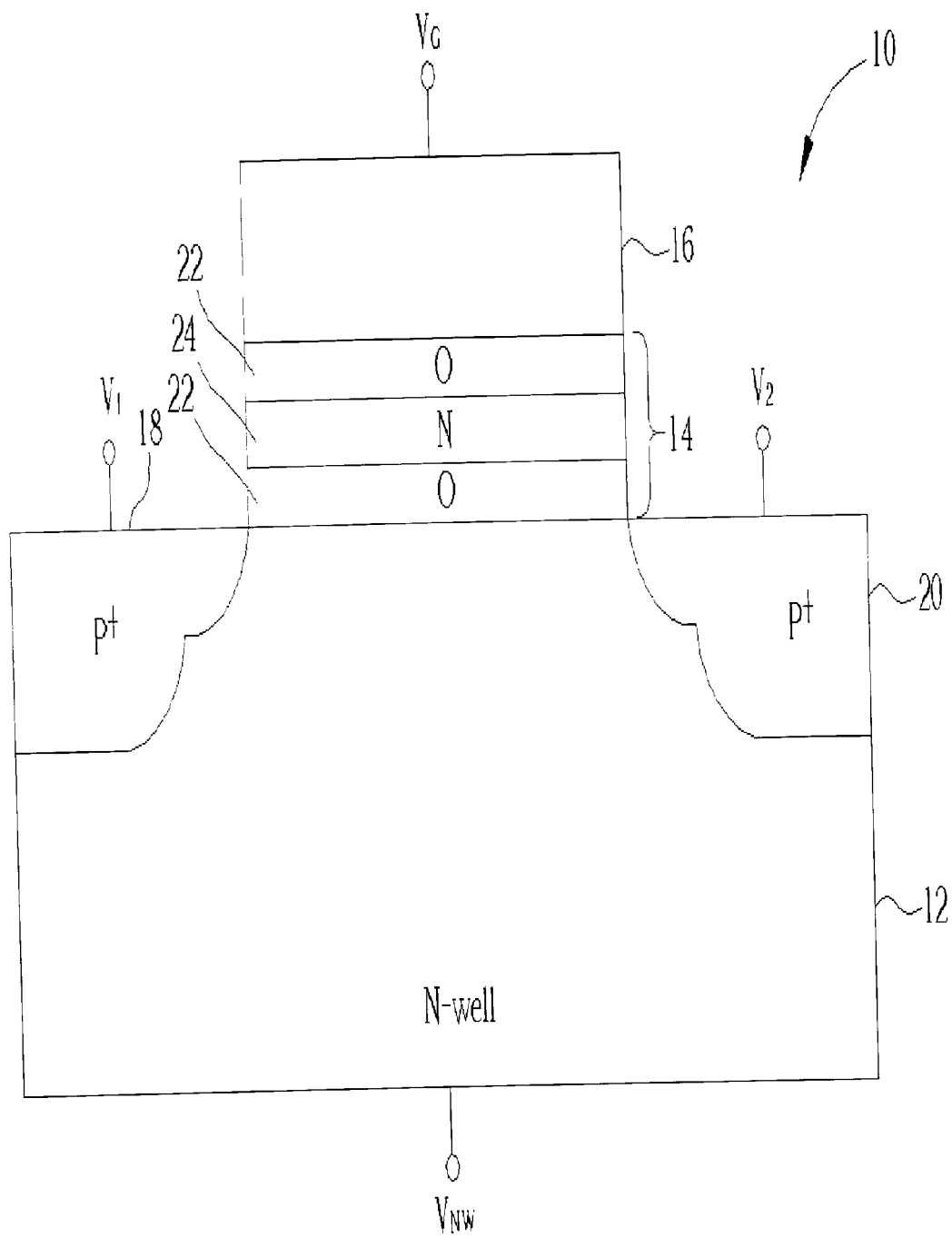
FIG. 1 is a cross section view of a P-type memory cell according to the present invention.
Figure 2:
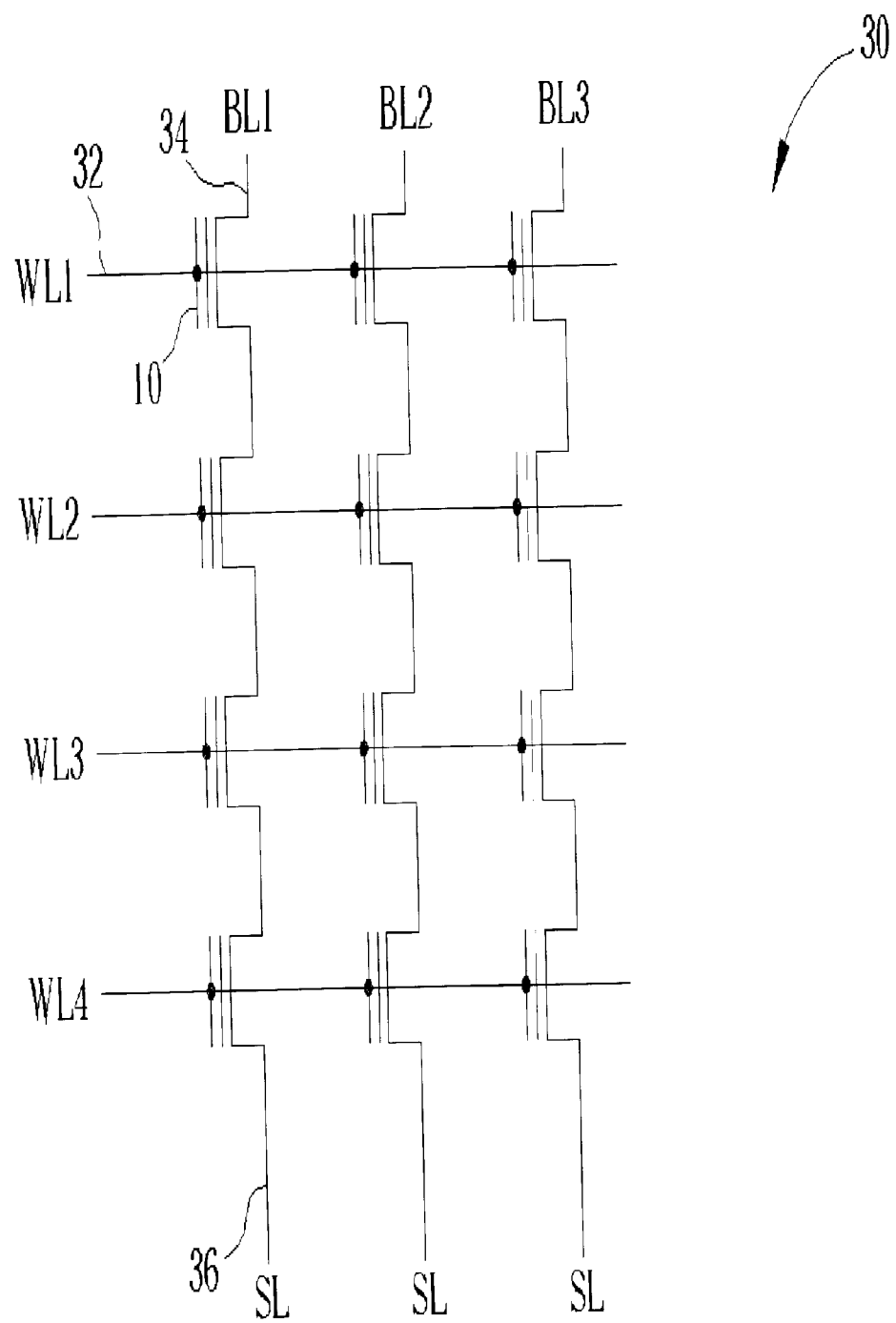
FIG. 2 illustrates a memory module according to the present invention.

Please refer to FIG. 1 showing a cross sectional view of a P-type memory cell 10, and to FIG. 2 showing a memory module 30 according to the present invention. As shown in FIG. 1, the P-type memory cell 10 includes an N-type well 12, an oxide-nitride-oxide (ONO) layer formed on the N-type well 12, a gate 16 formed on the N-type well 12, a first P-type doped region (drain) 18 formed on the N-type well 12 on a side of the ONO layer 14, and a second P-type doped region (source) 20 formed on the N-type well 12 on the other side of the ONO layer 14. In the preferred embodiment of the present invention, the N-type well 12 is formed on a P-type semiconductor substrate, the gate is a polysilicon layer, a policide layer, or a metal layer. The ONO layer 14 includes a lower silicon dioxide layer 22, a silicon nitride layer 24 and an upper silicon dioxide layer 22. When electrons are injected into the silicon nitride layer 24, they are limited and no longer migrate. Utilizing this characteristic, a memory cell 10 can store 2-bit data by injecting electrons into a position neighboring the first P-type doped region 18 and the second P-type doped region 20. As shown in FIG. 2, the memory module 30 is composed of a plurality of P-type memory cells 10 arranged in a matrix. The gates 16 of the memory cells on the same row are connected to the same word line 32, and the neighboring memory cells in the same column share a P-type doped region. In other words, in the same column, the source 20 of a memory cell shares a P-type doped region with the drain 18 of a previous memory cell, the drain 18 of a memory cell shares a P-type doped region with the source 20 of a next memory cell, and the first P-type doped region (drain) 18 of the first memory cell in each column is connected to a first transmission line (bit line) 34 of the same column. This kind of matrix connection is called a NAND-array, and since two neighboring memory cells share a P-type doped region, the NAND-array compresses more memory cells into each unit area and therefore stores more data.

Figure 3:
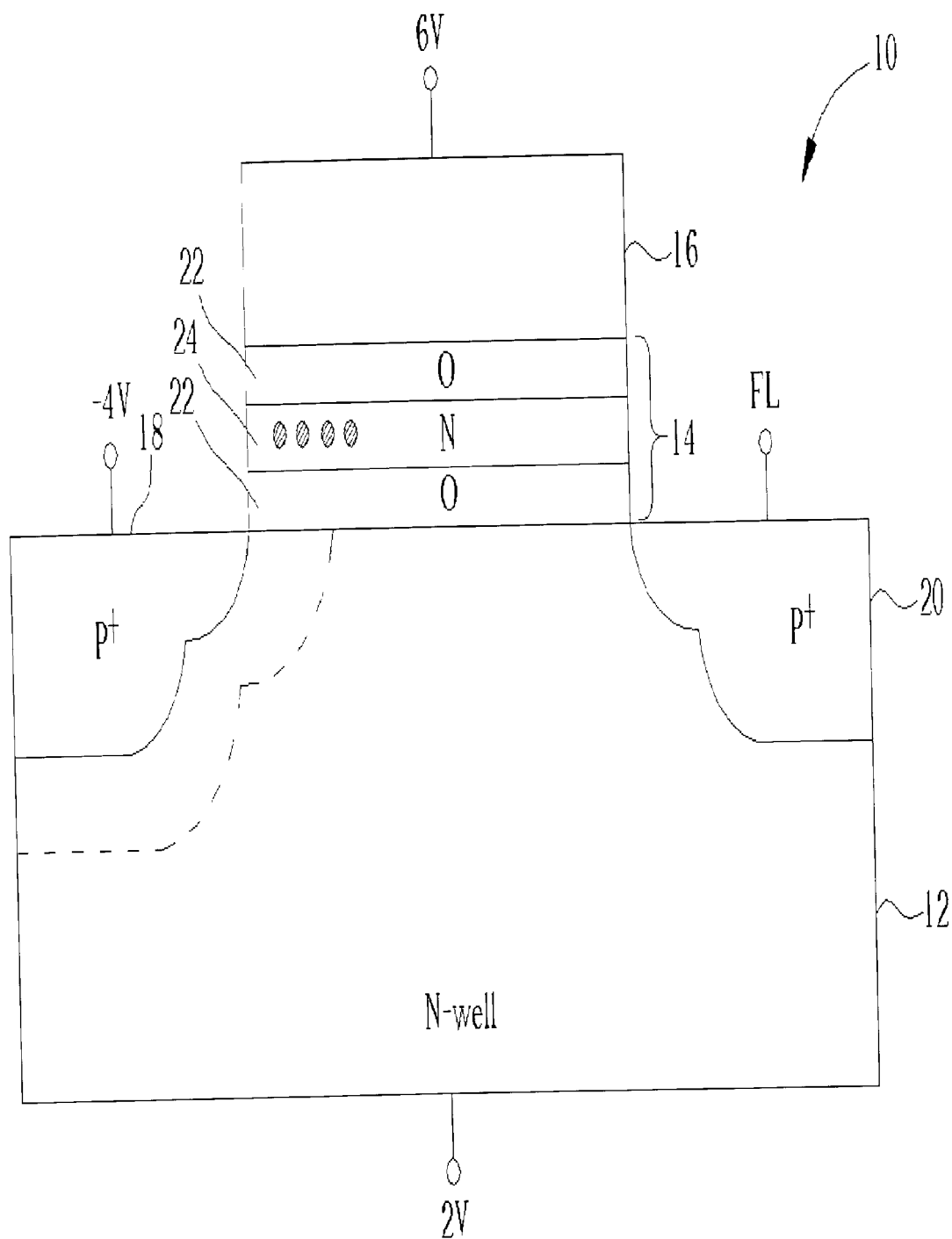
FIG. 3 illustrates the write operation of the P-type memory cell.
Figure 4:
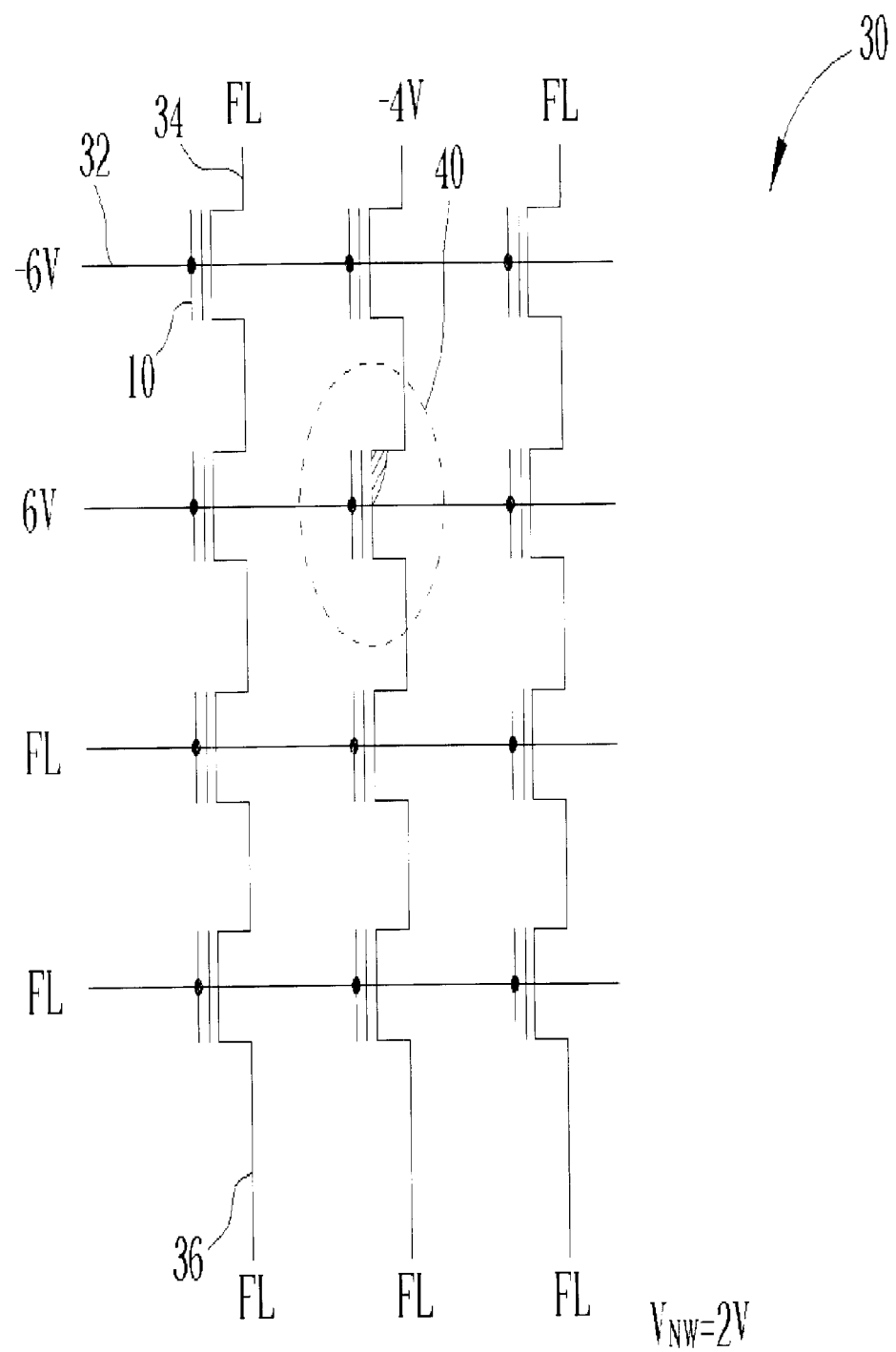
FIG. 4 illustrates the write operation of the memory module.

Please refer to FIG. 3 showing the write operation of the P-type memory cell 10, and FIG. 4 showing the write operation of the memory module 30 according to the present invention. In the present invention, the writing operation of the P-type memory cell 10 involves injecting electrons into the silicon nitride layer 24 of a memory cell to be written 40 using band-to-band tunneling hot electron injection. As shown in FIG. 3, in the case of injecting electrons into a position adjacent to the first P-type doped region 18 of the P-type memory cell 10, a voltage of 2V is applied to the substrate 12 ($V_{NW}$) of the P-type memory cell 10, a voltage of 6V is applied to the gate 16 ($V_G$), and a voltage of 4V is applied to the first P-type doped region 18. The second P-type doped region 20 ($V_2$) is connected to a floating node (FL). In this situation, the electrons are expelled to the surface of a channel by the lateral electric field of the first P-type doped region 18, and a part of the electrons are powered to break through the energy barrier by the silicon dioxide layer 22 and injected into the silicon nitride layer 24. This completes the left-bit data writing of the P-type memory cell 10. And in case of the right-bit data writing of the P-type memory cell 10, a voltage of 4V is applied to the second P-type doped region 20, while the first P-type doped region 18 is connected to a floating node (FL). The voltages applied on the gate 16 and the substrate 12 remain the same. The writing operation of the memory module 30 is the same to that of the single memory cell 10. Specifically, apply the voltages for the substrate 12, the gate 16, the first P-type doped region 18, and the second P-type doped region 20 necessary for writing a single memory cell 10 to the N-type well 12, the word line 32 (WL2), the first transmission line 34 (BL2), and the second transmission line 36 (SL2) respectively of the memory cell to be written 40 of the memory module, as shown in FIG. 4. Please notice that because the memory cells of each row are connected serially, it is necessary to turn on the P-type channel between the memory cell to be written 40 and the first transmission line 34 when applying the first transmission line 34 voltage of 4V to the first P-type doped region 18 of the memory cell to be written 40. It is therefore required to apply a voltage of 6V to each word line 32 (WL1) connecting these memory cells and to ensure the remaining lines are floating. When writing the NAND-array, since it is required to turn on the P-type channel between the memory cell to be written 40 and the first transmission line 34, the operational speed will be lowered. In the present invention, the P-type memory cells of the NAND-array utilize band-to-band tunneling hot electron injection to execute the write operation with low voltage, which reduces writing interference between the memory cells.

Figure 5:
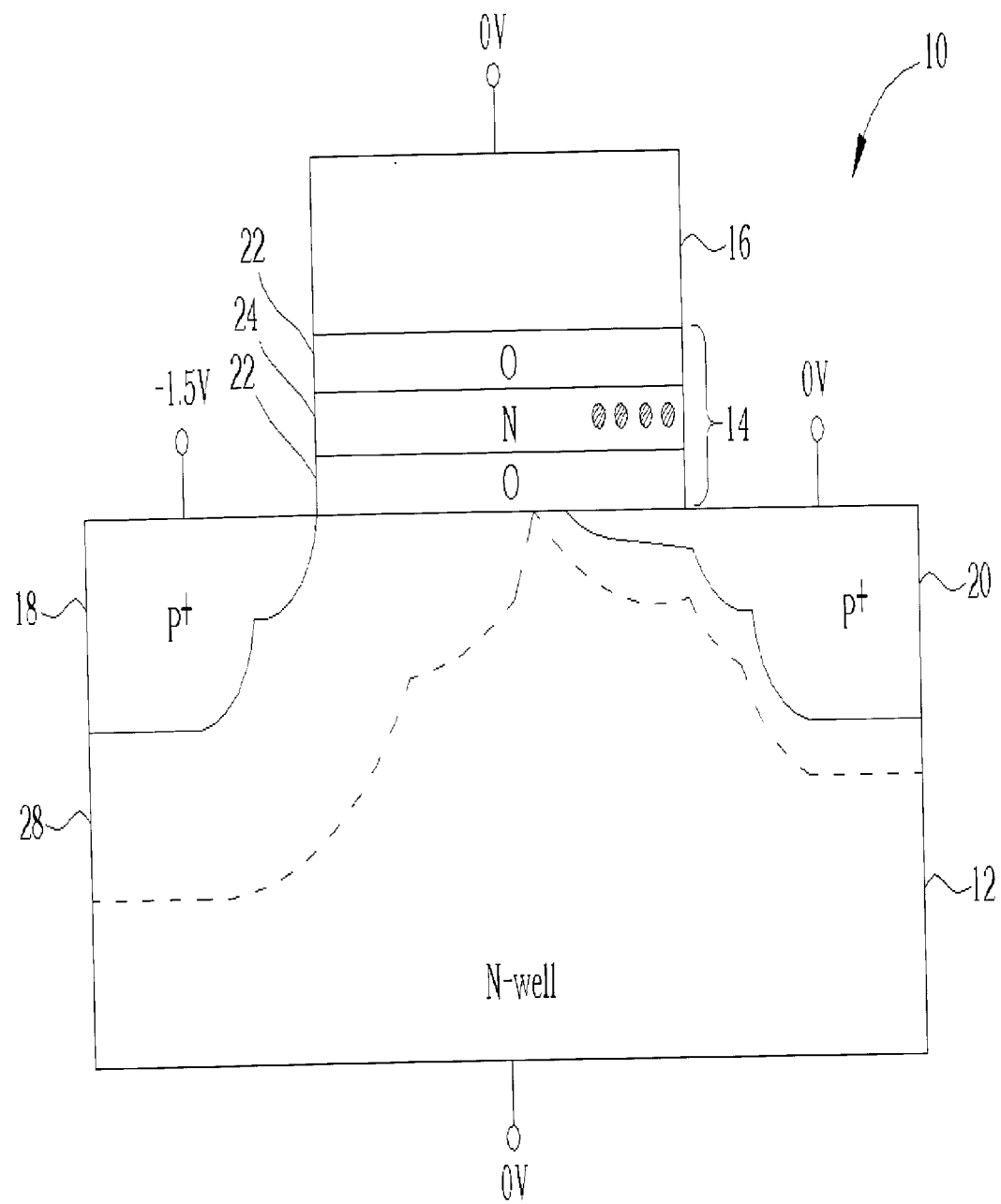
FIG. 5 illustrates the read operation of the P-type memory cell.
Figure 6:
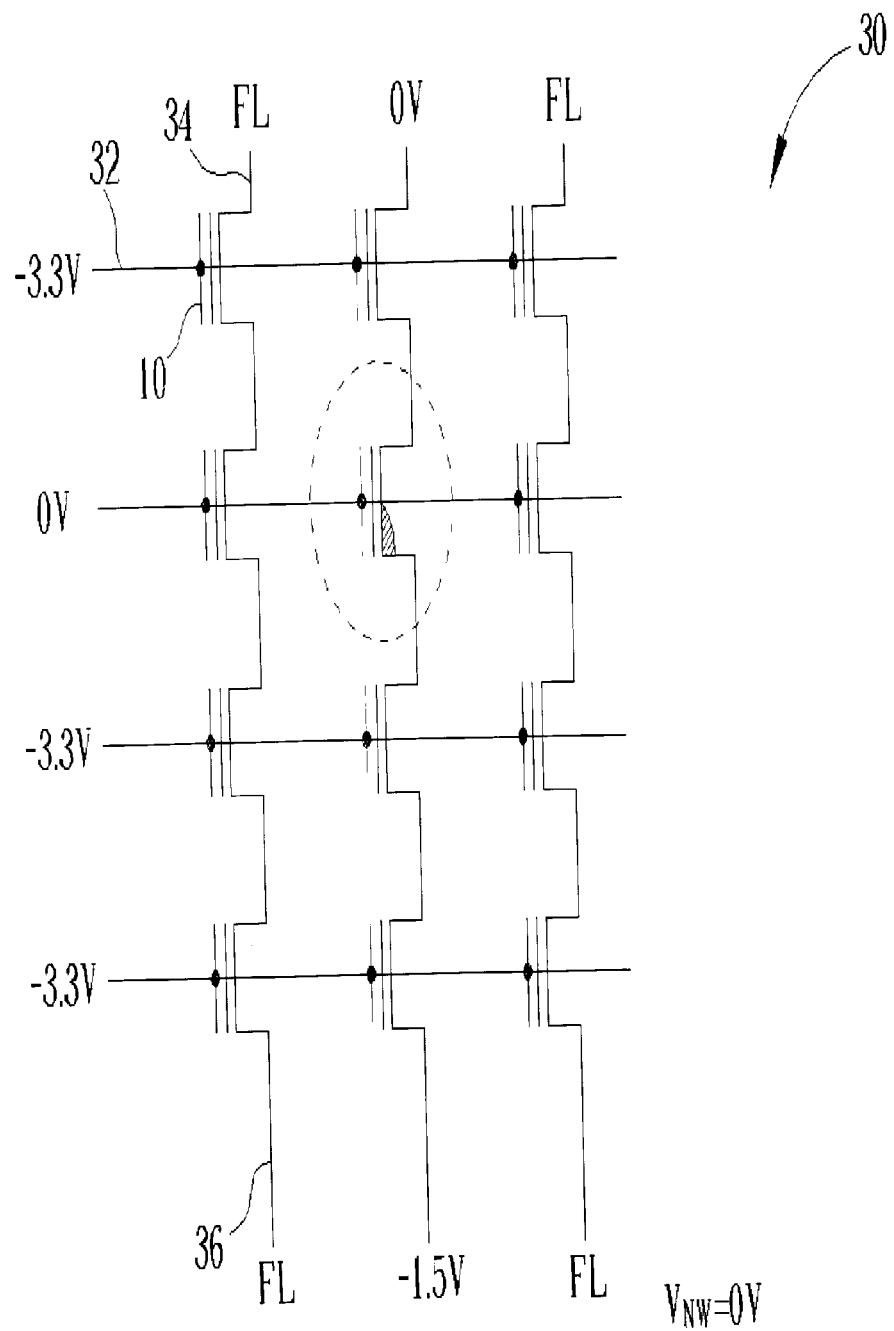
FIG. 6 illustrates the read operation of the memory module.

Please refer to FIG. 5 showing the read operation of the P-type memory cell 10, and to FIG. 6 showing the read operation of the memory module 30 according to the present invention. As shown in FIG. 5, when electrons are limited in the silicon nitride layer 24 adjacent to the second P-type doped region 20, the electrons attract the second P-type doped region 20 causing it to extend toward the first P-type doped region 10 so that the channel is shortened. Therefore, to read the right-bit data of the P-type memory cell 10, apply a voltage of 1.5V to the first P-type doped region 18 of the P-type memory cell 10, a voltage of 0V to the substrate 12 ($V_{NW}$), the gate 16 ($V_G$), and the second P-type doped region 20 ($V_2$) of the P-type memory cell 10. This will enlarge a depletion region 28 between the first P-type doped region 18 and the second P-type doped region 20 and punch through the first P-type doped region 18 and the second P-type doped region 20 to generate a conductive current. The value of the right-bit data of the memory cell can be read as 1. If the electrons are limited to the silicon nitride layer 24 adjacent to the first P-type doped region 18, apply a voltage of 1.5V to the second P-type doped region 20 of the P-type memory cell 10 to generate a conductive current. The value of the left-bit data of the memory cell can be read as 1. The read operation of the memory module 30 is shown in FIG. 6, which involves selecting a memory cell to be read 40, and then applying the voltages for the substrate 12, the gate 16, the first P-type doped region 18, and the second P-type doped region 20 to the N-type well 12, the word line 32 (WL2), the first transmission line 34 (BL2), and the second transmission line 36 (SL2) respectively. Please notice that the memory cell 10 of the memory module 30 can store both an upper bit and a lower bit. When reading the upper bit data of the memory cell, apply a voltage of 1.5V to the second transmission line 36, and when reading the lower bit data of the memory cell, apply a voltage of 1.5V to the first transmission line 34. Additionally, except for word line 32 (WL2), which is connected to the memory cell to be read 40 at the same voltage as that of the substrate 12, apply a voltage of 3.3V the remaining word lines 32 (WL1, WL3, WL4) in order to turn on the P-type channel of the memory cell to generate the conductive current.

Figure 7:
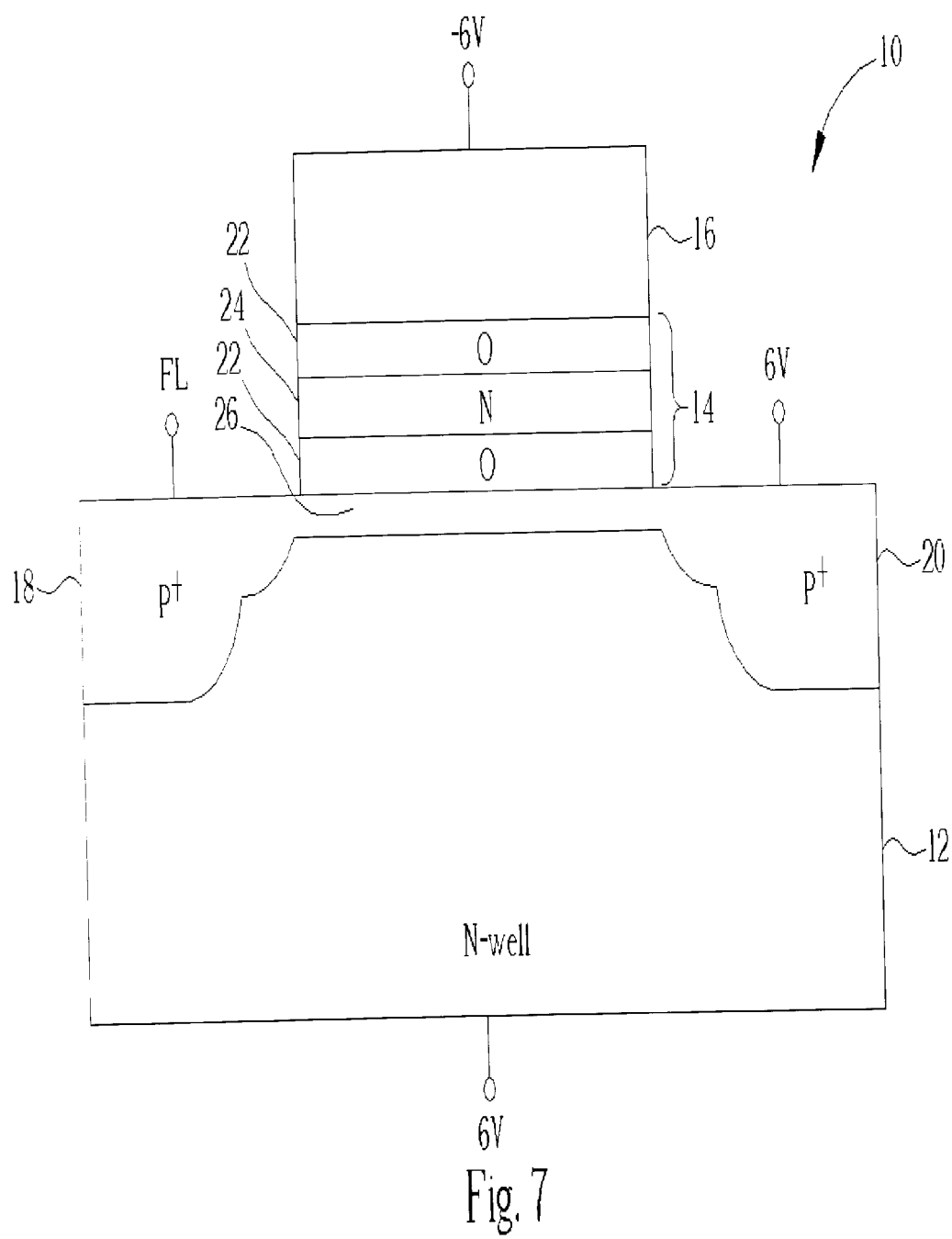
FIG. 7 illustrates the erase operation of the P-type memory cell.
Figure 8:
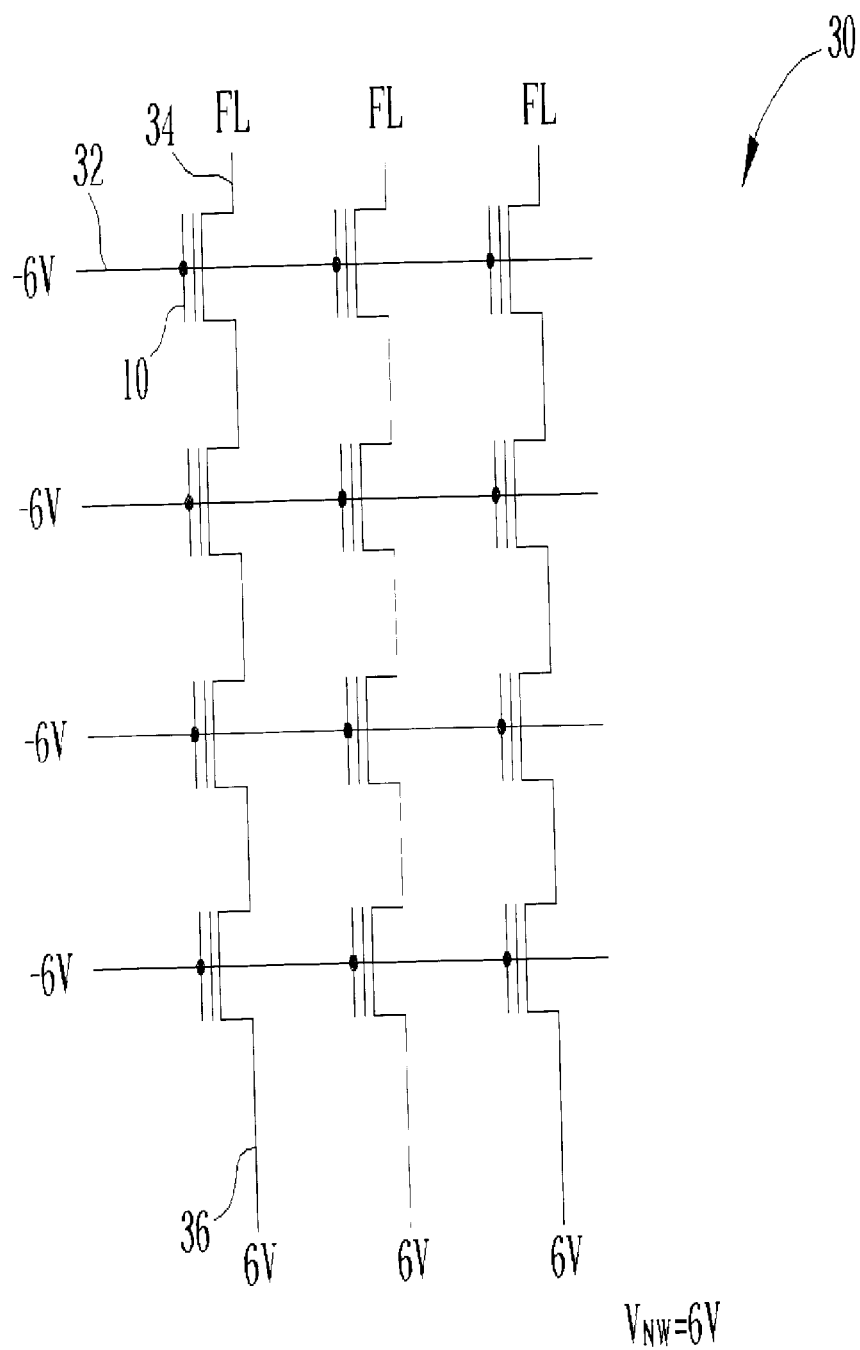
FIG. 8 illustrates the erase operation of the memory module.

Please refer to FIG. 7 showing the erase operation of the P-type memory cell 10, and to FIG. 8 showing the erase operation of the memory module 30 according to the present invention. The erase operation of the P-type memory cell 10 utilizes FN tunneling. As shown in FIG. 7, apply a voltage of 6V to the substrate 12 ($V_{NW}$) and the second P-type doped region 20 ($V_2$) of the P-type memory cell 10, and apply a voltage of −6V to the gate 16 ($V_G$) of the P-type memory cell. Since the P-type channel 26 of the P-type memory cell is turned on, the voltage of the first P-type doped region 18 will be conducted to 6V so that it can be left floating. In this case, the cross voltage on the ONO layer 14 is 12V, so that the electrons limited in the silicon nitride layer can be discharged into N-well and complete erase operation. As shown in FIG. 8, when erasing the memory cell of the memory module 30, apply a voltage of 6V to the second transmission lines 36 (SL1~SL3) and the N-type well 12, and then apply a voltage of 6V to all the word lines 32 (WL1~WL4).

Figure 9:
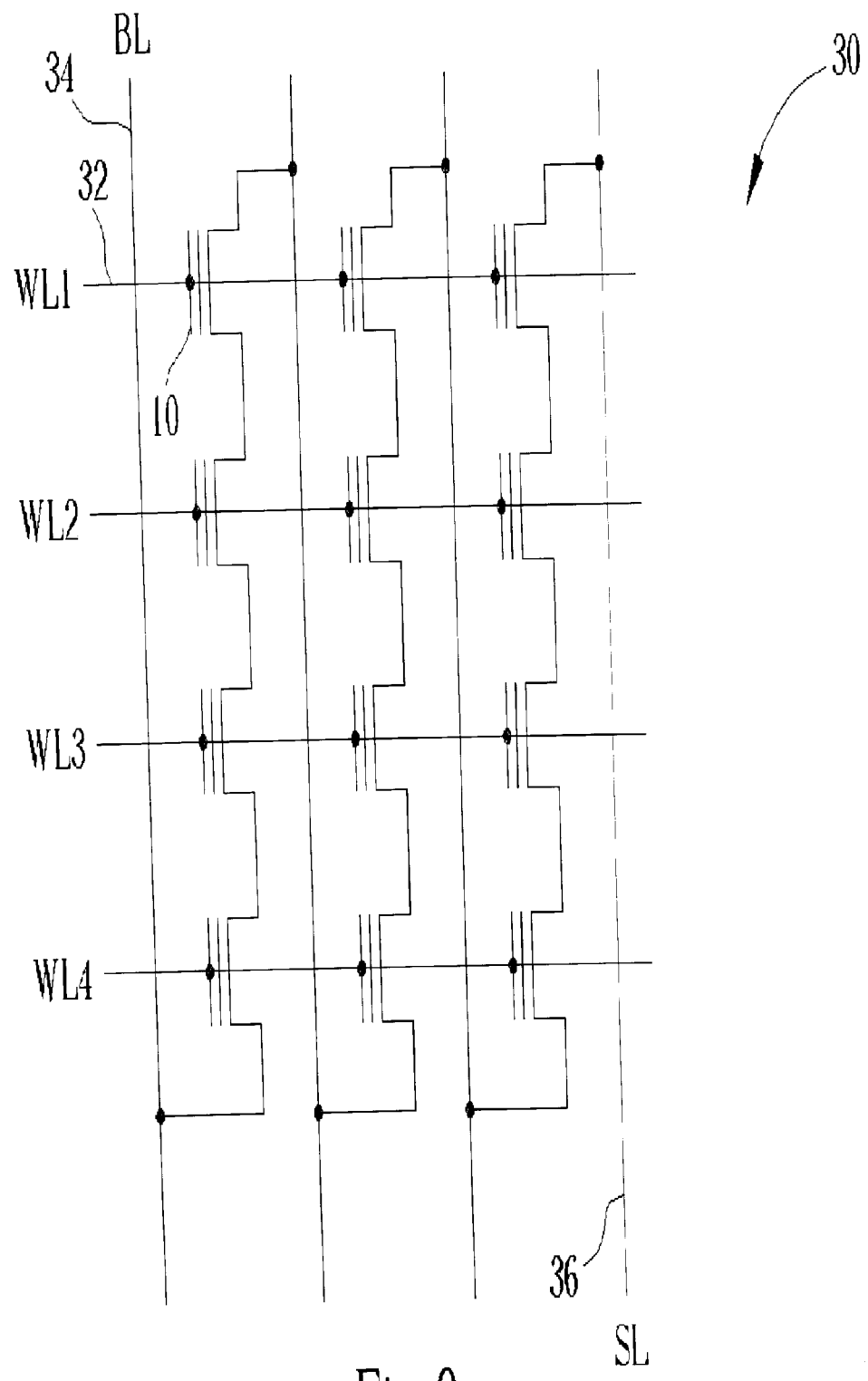
FIG. 9 illustrates another structure of the memory module according to the second embodiment of the present invention.

Please refer to FIG. 9 showing another structure of the memory module according to the second embodiment of the present invention. A first transmission line of each column is connected to a second transmission line of a previous column, and the second transmission line of each column is connected to the first transmission line of a next column. In other words, two neighboring columns share a transmission line, so that the memory cells of the whole memory module are connected serially with each other. Such a connection is called a virtual ground, which conserves layout area. After connecting the memory module in a virtual ground connection, the first P-type doped region (drain) of the first memory cell on the first column is connected to the first transmission line (bit line), and the second P-type doped region (source) of the last memory cell on the last column is connected to the second transmission line (source line). The writing, reading, and erasing operations are similar to the previous embodiment, the only difference being the operational voltage is input through the first transmission line (BL) and the second transmission line (SL).

Please refer to FIG. 10 showing a voltage contrast list according to the preferred embodiment of the present invention. The list in FIG. 10 shows preferred voltages for the writing, reading, and erasing operations of the P-type memory cell and the memory modules of FIG. 2 to FIG. 8. The same indicators are used as those in FIG. 1 and FIG. 2. However, the voltage parameters listed in FIG. 10 are only for reference and do not limit the range of the present invention. Moreover, all the operational voltages, including the substrate voltage, the gate voltage, the source voltage, the drain voltage, the N-type well voltage, the source line voltage, the word line voltage, and the bit line voltage can shift for an appropriate value to become positive voltages.

As mentioned above, the NAND-array memory module includes a plurality of P-type memory cells, and each P-type memory cell includes an ONO layer to store 2-bit data, so that the capacity and the density of the memory module are increased. The operating methods of the NAND-array memory include a write operation using band-to-band hot electron injection, a read operation using reverse reading, and an erase operation using FN tunneling. For the NAND-array memory composed of the P-type memory cells, band-to-band hot electron injection can reduce writing interference between memory cells. Moreover, since the memory module can operate under low voltage, it can be manufactured by a typical CMOS manufacturing process instead of a special process, so that the memory module can be integrated on a typical logic chip. Additionally, the ONO layer can be manufactured by utilizing a mask in a typical CMOS manufacturing process.

In contrast to the prior art, the operating method of the NAND-array memory composed of the P-type according to the present invention has advantages of high density, high capacity, high stability, low voltage, and low power consumption. Additionally, it can be manufactured using a typical CMOS manufacturing process and can be more widely used than the conventional memory module composed of N-type memory cells.

Those skilled in the art will readily observe that numerous modifications and alterations of the method may be made while retaining the teachings of the invention. Accordingly, the above disclosure should be construed as limited only by the metes and bounds of the appended claims.

What is claimed is:

1. A method for writing a memory module comprising:
   providing a plurality of memory cells, wherein each memory cell stores 2-bit data and comprises a substrate, a first P-type doped region, a second P-type doped region, an oxide-nitride-oxide (ONO) layer, and a gate, the plurality of memory cells being arranged in matrix with the gates of the memory cells on the same row being connected to the same word line, the neighboring memory cells on the same column sharing the same P-type doped region, the first P-type doped region of the first memory cell in each column connected to a first transmission line in the same column, and the second P-type doped region of the last memory cell in each column connected to a second transmission line in the same column;
   applying a first transmission line voltage to the first transmission line of the column which a memory cell to be written belongs to;

turning on a P-type channel of the memory cell between the memory cell to be written and the first transmission line of the column which the memory cell to be written belongs to, in order to transmit the first transmission line voltage to the first P-type doped region of the memory cell to be written;

turning off the P-type channel of at least one memory cell between the memory cell to be written and the second transmission line of the column which the memory cell to be written belongs to;

applying a word line voltage to a word line connected to the memory cell to be written, in order to inject hot electrons on a junction between the substrate and the first P-type doped region of the memory cell to be written into a silicon nitride layer of the memory cell to be written by band-to-band tunneling (BTBT) injection; and applying a substrate voltage to the substrates of the plurality of memory cells.

2. The method of claim 1, wherein the first P-type doped region is for a drain of the memory cell, the second P-type doped region is for a source of the memory cell, the voltage of the first transmission line is 4V, and the voltage of the word line is 6V, so that hot electrons on the junction between the substrate and the drain of the memory cell to be written into the silicon nitride layer of the memory cell to be written by BTBT injection form a first-bit data.

3. The method of claim 1, wherein the first P-type doped region is for a source of the memory cell, the second P-type doped region is for a drain of the memory cell, the voltage of the first transmission line is 4V, and the voltage of the word line is 6V, so that hot electrons on the junction between the substrate and the drain of the memory cell to be written into the silicon nitride layer of the memory cell to be written by BTBT injection form a second-bit data.

4. The method of claim 1, wherein the matrix is a NAND-array.

5. The method of claim 1, wherein the first transmission line in each column is connected to the second transmission line in a previous column, the second transmission line in each column is connected to the first transmission line in a next column, in order to connect the plurality of memory cells serially to form a virtual ground.

6. A method for reading a memory module comprising:
providing a plurality of memory cells, wherein each memory cell stores 2-bit data and comprises a substrate, a first P-type doped region, a second P-type doped region, an ONO layer, and a gate, the plurality of memory cells being arranged in a matrix with the gates of the memory cells on the same row being connected to the same word line, the neighboring memory cells in the same column sharing the same P-type doped region, the first P-type doped region of the first memory cell in each column being connected to a first transmission line in the same column, and the second P-type doped region of the last memory cell in each column being connected to a second transmission line in the same column;

applying a first transmission line voltage to the first transmission line of the column which a memory cell to be read belongs to;

applying a second transmission line voltage lower than the first transmission line voltage to the second transmission line of the column which the memory cell to be read belongs to;

applying a voltage equal to the first transmission line voltage to a word line connected to the memory cell to be read;

applying a voltage equal to the first transmission line voltage to the substrates of the plurality of memory cells; and applying a word line voltage to the remaining word lines not connected to the memory cell to be read, in order to turn on a P-type channel of the memory cell, to transmit the second transmission line voltage to the second P-type doped region of the memory cell to be read, and to enlarge a depletion region between the second P-type doped region and the substrate of the memory cell to be read.

7. The method of claim 6, wherein the first P-type doped region is for a drain of the memory cell, and the second P-type doped region is for a source of the memory cell.

8. The method of claim 6, wherein the first P-type doped region is for a source of the memory cell, and the second P-type doped region is for a drain of the memory cell.

9. The method of claim 6, wherein the first transmission line voltage is 0V, the second transmission line voltage is 1.5V, and the word line voltage is 3.3V.

10. The method of claim 6, wherein the matrix is a NAND-array.

11. The method of claim 6, wherein the first transmission line in each column is connected to the second transmission line in a previous column, the second transmission line in each column is connected to the first transmission line in a next column, in order to connect the plurality of memory cells serially to form a virtual ground.

12. A method for erasing a memory module comprising:
providing a plurality of memory cells, wherein each memory cell stores 2-bit data and comprises a substrate, a first P-type doped region, a second P-type doped region, an ONO layer, and a gate, the plurality of memory cells being arranged in a matrix with the gates of the memory cells on the same row being connected to the same word line, the neighboring memory cells in the same column sharing the same P-type doped region, the first P-type doped region of the first memory cell in each column being connected to a first transmission line in the same column, and the second P-type doped region of the last memory cell in each column connected to a second transmission line in the same column;

applying a word line voltage to word lines of the plurality of memory cells;

applying a first transmission line voltage larger than the word line voltage to the first transmission line of the plurality of memory cells; and applying a voltage equal to the first transmission line voltage to the substrates of the plurality of memory cells.

13. The method of claim 12, wherein the word line voltage is 6V, and the first transmission line voltage is 6V.

14. The method of claim 12, wherein the matrix is a NAND-array.

15. The method of claim 12, utilizing Fowler-Nordheim tunneling to erase the electrons limited in the ONO layer.

16. The method of claim 12, wherein the first transmission line in each column is connected to the second transmission line in a previous column, the second transmission line in each column is connected to the first transmission line in a next column, in order to connect the plurality of memory cells serially to form a virtual ground.

* * * * *